(12) United States Patent
Nyui et al.

(10) Patent No.: US 7,916,273 B2
(45) Date of Patent: Mar. 29, 2011

(54) EXPOSURE APPARATUS AND DEVICE MANUFACTURING METHOD

(75) Inventors: Masaru Nyui, Utsunomiya (JP); Keiko Chiba, Utsunomiya (JP); Keiji Yamashita, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 596 days.

(21) Appl. No.: 11/559,084

(22) Filed: Nov. 13, 2006

(65) Prior Publication Data

US 2007/0109514 A1    May 17, 2007

(30) Foreign Application Priority Data

Nov. 16, 2005  (JP) ................. 2005-331330

(51) Int. Cl.
*G03B 27/42* (2006.01)
*G03B 27/52* (2006.01)

(52) U.S. Cl. .......................... 355/53; 355/30
(58) Field of Classification Search .......... 355/30, 355/53, 67, 71, 77
See application file for complete search history.

(56) References Cited

U.S. PATENT DOCUMENTS

| 5,825,043 | A | 10/1998 | Suwa |
| 7,405,805 | B2 * | 7/2008 | Uitterdijk et al. ........... 355/53 |
| 7,545,481 | B2 * | 6/2009 | Streefkerk et al. ........... 355/67 |
| 7,619,715 | B2 * | 11/2009 | Ono et al. ........... 355/53 |
| 2005/0024609 | A1 | 2/2005 | DeSmit et al. |
| 2005/0110973 | A1 | 5/2005 | Streefkerk et al. |
| 2005/0225734 | A1 | 10/2005 | De Smit et al. |
| 2006/0203218 | A1 * | 9/2006 | Shirai et al. ........... 355/53 |
| 2006/0231206 | A1 | 10/2006 | Nagasaka et al. |
| 2009/0180090 | A1 * | 7/2009 | Hara ............... 355/53 |

FOREIGN PATENT DOCUMENTS

| EP | 1 486 828 | 12/2004 |
| EP | 1 670 038 | 6/2006 |
| JP | 10-154659 A | 6/1998 |
| JP | 2002-036085 A | 2/2002 |
| JP | 2005-005713 | 1/2005 |
| JP | 2005-129810 | 5/2005 |
| JP | 2005-202375 A | 7/2005 |
| JP | 2005-203681 | 7/2005 |
| JP | 2005-286286 | 10/2005 |
| JP | 2006-178327 A | 7/2006 |
| WO | 2005/020298 | 3/2005 |
| WO | 2005/029559 A1 | 3/2005 |

OTHER PUBLICATIONS

Communication from European Patent Office including European Search Report dated Oct. 29, 2007.

* cited by examiner

*Primary Examiner* — Hung Henry Nguyen
(74) *Attorney, Agent, or Firm* — Rossi, Kimms & McDowell LLP

(57) ABSTRACT

An exposure apparatus includes an illumination optical system for illuminating a reticle using a light from a light source, and a projection optical system for projecting a pattern of the reticle onto a substrate, the exposure apparatus exposing the substrate through a liquid that is supplied to a space between the substrate and a lens of the projection optical system closest to the substrate, a surface of the lens on which the light does not pass having a polished surface.

7 Claims, 5 Drawing Sheets

EXPOSURE APPARATUS AND DEVICE MANUFACTURING METHOD

BACKGROUND OF THE INVENTION

The present invention relates generally to an exposure apparatus, and more particularly to an exposure apparatus used to expose a substrate such as a wafer for a semiconductor device, and a glass plate for a liquid crystal device. The present invention is suitable, for example, for a so-called immersion exposure apparatus that immerses in the liquid the final surface of the projection optical system and the surface of the substrate, and exposes the substrate via the liquid.

A reduction projection exposure apparatus has been conventionally employed which uses a projection optical system to project a circuit pattern of a reticle (mask) onto a wafer, etc. to transfer the circuit pattern, in manufacturing such a fine semiconductor device in the photolithography technology.

The minimum critical dimension ("CD") transferable by the reduction projection exposure apparatus or resolution is proportionate to the wavelength of the light used for exposure, and inversely proportionate to the numerical aperture ("NA") of the projection optical system. The shorter the wavelength is, the better the resolution is. Along with the recent demands for finer semiconductor devices, use of the UV light with a shorter wavelength has been promoted from an KrF excimer laser (with a wavelength of approximately 248 nm) to an ArF excimer laser (with a wavelength of approximately 193 nm).

In this setting, the immersion exposure is one attractive technology to improve the resolution while using a light source, such as the ArF excimer laser. The immersion exposure fills a space between the final surface of the projection optical system and the wafer with the liquid, shortening the effective wavelength of the exposure light, increasing the apparent NA of the projection optical system, and improving the resolution. Since the NA of the projection optical system is defined as NA=n·sin θ, where n is a refractive index of the (liquid) material, the NA increases up to "n" when the filled material has a refractive index greater than that of the air (n>1).

In the immersion exposure, there are roughly two methods of filling the liquid in the space between the final surface of the projection optical system and the wafer: The first method is a method of sinking the final surface of the projection optical system and the entire wafer in a bath. The second method is a local fill method that flows the liquid only in the space between the projection optical system and the wafer surface. Some exposure apparatuses are proposed which use the local fill method. See, for example, Japanese Patent Applications, Publication Nos. 2005-5713, 2005-129810, 2005-286286, and 2005-203681.

The immersion exposure resolves a CD (half pitch) between 40 nm and 60 nm, and the particles floating in the liquid harm the pattern formation. For instance, the particle that adheres to the wafer surface would break the wire structure, and the particle that floats above the wafer surface would partially block the light from the projection optical system, causing the low contrast part.

The particles mixed in the liquid mainly originate from abrasive, such as cerium oxide and iron oxide, and a pitch material, such as asphalt, which are used to polish the lens surface of the final lens in the projection optical system closest to the wafer. These materials adhere to an uneven edge face or side surface of the final lens, dry and fix on the edge face of the final lens due to the storage condition from the polishing process to the cleansing process. The cleansing process that combines alkali cleansing and fluoric acid cleansing cannot remove the particles, such as the abrasive and the pitch material, which are fixed on the edge face of the final lens. When the optical lens having the particles adhered edge face are incorporated into the exposure apparatus, the particles separates from the edge face and floats in the liquid due to the liquid action between the edge face and the liquid supply/recovery tube near the edge face. Since it is tardier to exchange the liquid that exists between the supply/recovery tube and the edge face than to exchange the liquid that exists between the final lens and the wafer, the particles floating in the liquid that exists between the supply/recovery tube near the edge face are likely to agglutinate into a large growing lump.

In addition, the surface of the supply/recovery tube also contacts the liquid, the particle that adheres to the surface can separate and float in the liquid.

Moreover, a top-flatted plate (auxiliary plate) level with the top surface of the wafer also contacts the liquid, and the particle that adheres to the surface is likely to separate and float in the liquid as discussed above.

The particles mixed in the liquid contain a particle caused by a agglutination due to a chemical reaction of the resist applied onto the wafer, and a particle that is generated at the wafer edge while the wafer is being fed to the exposure apparatus.

SUMMARY OF THE INVENTION

The present invention is directed to an exposure apparatus that reduces the particles from the liquid, and achieves excellent optical characteristic.

An exposure apparatus according to one aspect of the present invention includes an illumination optical system for illuminating a reticle using a light from a light source, and a projection optical system for projecting a pattern of the reticle onto a substrate, the exposure apparatus exposing the substrate through a liquid that is supplied to a space between the substrate and a lens of the projection optical system closest to the substrate, a surface of the lens on which the light does not pass having a polished surface.

Other objects and further features of the present invention will become readily apparent from the following description of the preferred embodiments with reference to accompanying drawings.

DESCRIPTION OF THE EMBODIMENTS

Figure 1:
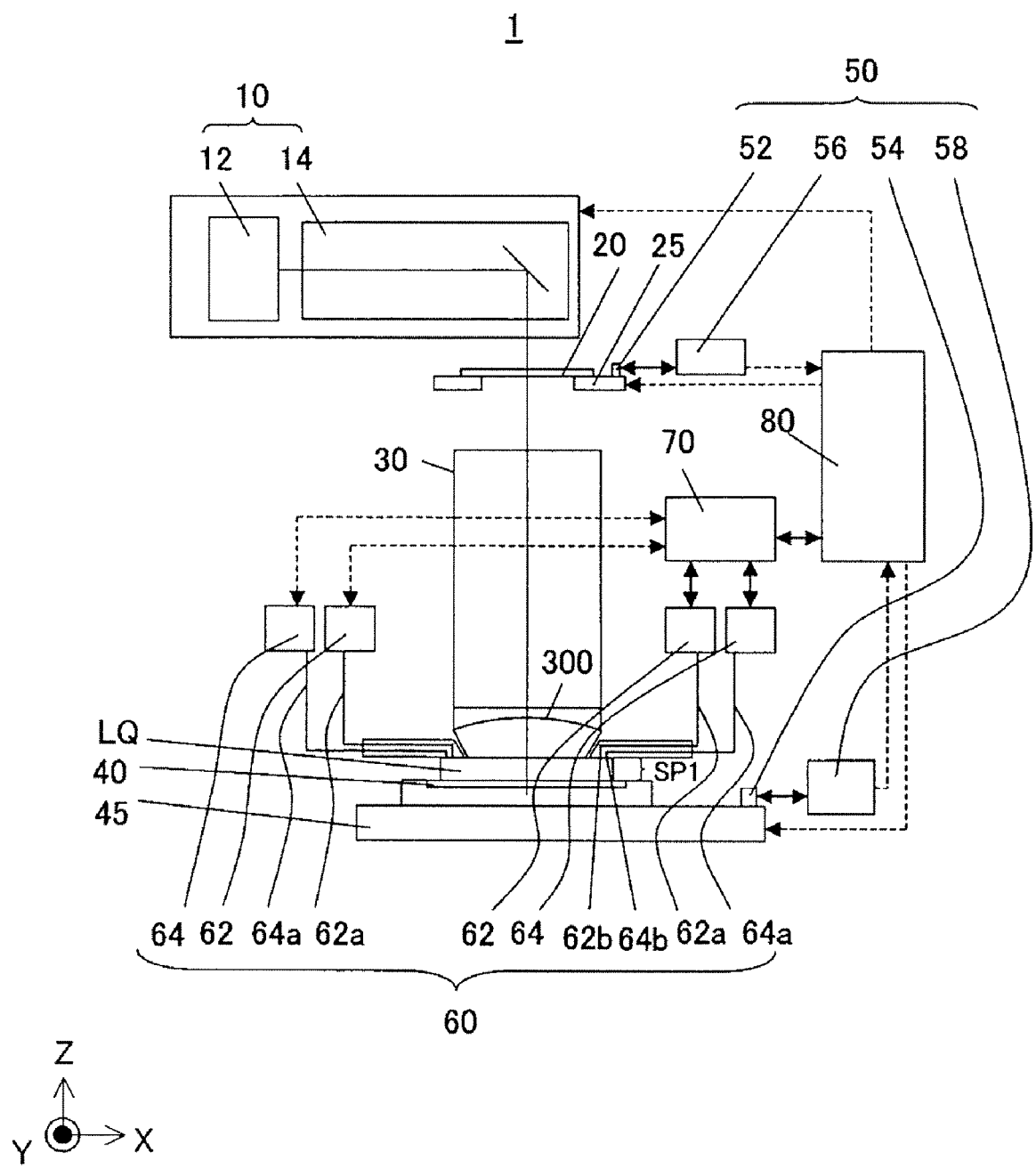
FIG. 1 is a schematic sectional view of an exposure apparatus according to one aspect of the present invention.

Referring now to the accompanying drawings, a description will be given of an exposure apparatus according to one aspect of the present invention. In each figure, the same elements are designated by the same reference numerals, and a duplicate description thereof will be omitted. Here, FIG. 1 is a schematic sectional view of the illustrative inventive exposure apparatus 1.

The exposure apparatus 1 is an immersion projection exposure apparatus that exposes a circuit pattern of a reticle 20 onto a wafer 40, via a liquid LQ supplied to a space between the wafer 40 and the final (lens) surface of the projection optical system 30 closest to the wafer 40. The final surface of the projection optical system 30 closest to the wafer 40 belongs to a final lens 300 at the wafer 40 side in this embodiment.

The exposure apparatus 1 exposes the wafer 40 in a step-and-scan manner or step-and-repeat manner. This embodiment will discuss a step-and-scan exposure apparatus as an example.

The exposure apparatus 1 includes, as shown in FIG. 1, an illumination apparatus 10, a reticle stage 25 that supports the reticle 20, a projection optical system 30, a wafer stage 45 that supports the wafer 40, a distance-measuring means 50, a liquid supply/recovery unit 60, an immersion controller 70, and a (main) controller 80.

The illumination apparatus 10 illuminates the reticle 20 that has a circuit pattern to be transferred. The illumination apparatus 10 includes a light source unit 12, and an illumination optical system 14.

The light source unit 12 can use, as a light source, for example, an ArF excimer laser with a wavelength of approximately 193 nm or an KrF excimer laser with a wavelength of approximately 248 nm. However, the type of the light source is not limited to the excimer laser, and may use, for example, an $F_2$ laser with a wavelength of approximately 157 nm.

The illumination optical system 14 is an optical system that illuminates the reticle 20 using light from the light source unit 12.

The reticle 20 is fed from the outside of the exposure apparatus 1 by a reticle feed system (not shown), and is supported and driven by the reticle stage 25. The reticle 20 is made, for example, of quartz, and has a circuit pattern to be transferred. The diffracted light emitted from the reticle 20 passes the projection optical system 30, and is projected onto the wafer 40. The reticle 20 and the wafer 40 are located in an optically conjugate relationship. Since the exposure apparatus 1 of this embodiment is a step-and-scan system, the reticle 20 and the wafer 40 are scanned at a speed ratio of the reduction ratio, thus transferring the pattern of the reticle 20 to the wafer 40.

The reticle stage 25 is attached to a stool (not shown). The reticle stage 25 supports the reticle 20 via a reticle chuck, and its movement is controlled by a moving mechanism (not shown) and the controller 80. The moving mechanism (not shown) includes a linear motor, etc., and drives the reticle stage 25 to move the reticle 20 in the X direction.

The projection optical system 30 is an optical system that projects the image of the pattern of the reticle 20. The projection optical system 30 may use a dioptric optical system solely including a plurality of lens, a catadioptric optical system including a plurality of lens and at least one mirror, and so on.

The wafer 40 is fed from the outside of the exposure apparatus 1 by a wafer fed system (not shown), and supported and driven by the wafer stage 45. The substrate to be exposed is the wafer 40 in this embodiment, but the substrate may broadly cover a glass plate and an object to be exposed. A photoresist is applied onto the wafer 40.

The wafer stage 45 supports the wafer 40 via a wafer chuck (not shown). The wafer stage 45 serves to adjust a position in the vertical or longitudinal direction, a rotational direction and an inclination of the wafer 40, under control of the controller 80. During exposure, the controller 80 controls the wafer stage 45 so that the surface of the wafer 40 (exposure area) always accords with the focal plane of the projection optical system 30 with high precision.

The distance-measuring means 50 measures a position of the reticle stage 25, a two-dimensional position of the wafer stage 45 on real-time basis, via reference mirrors 52 and 54, and laser interferometers 56 and 58. The distance measurement result is transmitted from the distance-measuring means 50 to the controller 80, and the reticle stage 25 and the wafer stage 45 are driven at a constant speed ratio under control of the controller 80 for positioning and synchronous control.

The liquid supply/recovery unit 60 serves to supply the liquid LQ into and recover the liquid LQ from the space SP1 between the wafer 40 and the final lens 300 of the projection optical system 30 closest to the wafer 40. The liquid supply/recovery unit 60, as described later, locally fills the liquid LQ in the exposure area and a limited area around it. In other words, the liquid supply/recovery unit 60 forms a layer of the liquid LQ in the local fill state in the space SP1 between the projection optical system 30 and the wafer 40. The liquid supply/recovery unit 60 of this embodiment includes a liquid supply unit 62, and a liquid recovery unit 64.

The liquid LQ serves to improve the resolution in the exposure by shortening the equivalent exposure wavelength of the exposure light from the light source unit 12. The liquid LQ is pure water in this embodiment, but is not specifically limited to the pure water. Any liquid may be used as long as it has a high transmittance characteristic and refractive index characteristic to the wavelength of the exposure light and it is chemically stable to the photoresist applied to the wafer 40 and the final lens 300 in the projection optical system 30. For example, the liquid LQ may use, for example, water that contains a small amount of additive, and a fluoric inert liquid.

Figure 2:
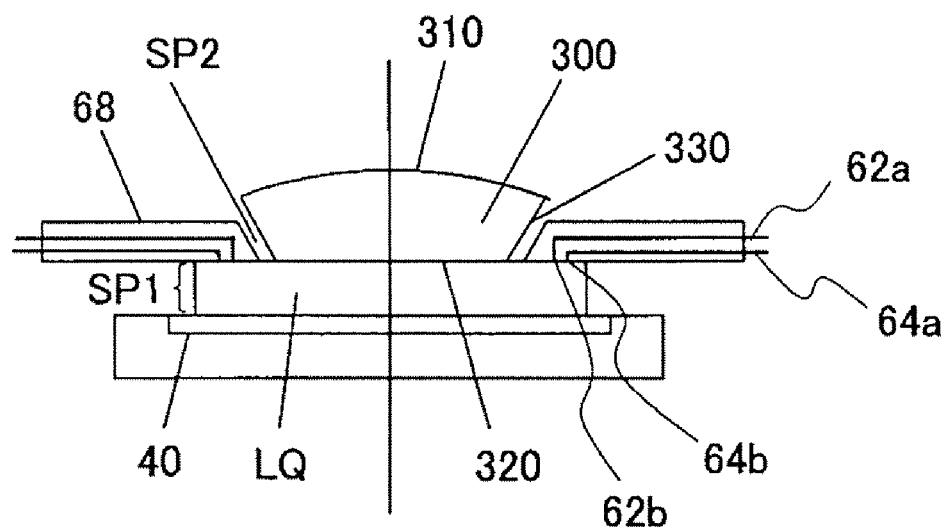
FIG. 2 is an enlarged sectional view around a final lens in a projection optical system shown in FIG. 1.

The liquid supply unit 62 has a supply tube 62a, and a supply nozzle 62b. The liquid supply unit 62 supplies the liquid LQ to the space SP1 between the projection optical system and the wafer 40 via the supply tube 62a and the supply nozzle 62b. The supply tube 62a is arranged, as shown in FIG. 2, around a side surface (or edge face) 330 of the final lens 300 in the projection optical system 30. The supply nozzle 62b is connected to the liquid supply/recovery unit 62 via the supply tube 62a. FIG. 2 is an enlarged sectional view around the final lens 300 of the projection optical system 30.

The side surface 330 of the final lens 300 does not contribute to the optical operation of the final lens 300, or the light that is emitted from the light source unit 12 and used to expose the wafer 40 does not pass the side surface 300. On the other hand, first and second surfaces 310 and 320 of the final lens 300 contribute to the optical operation of the final lens 300, or the light that is emitted from the light source unit 12 and used to expose the wafer 40 passes these surfaces 310 and 320.

The liquid supply unit 62 preferably includes, for example, a tank that stores the liquid LQ, and a pressure feeder that feeds the liquid LQ. Moreover, the liquid supply unit 62 preferably includes a temperature controller that controls the temperature of the supplied liquid LQ.

The liquid recovery unit 64 includes a recovery tube 64a, and a recovery nozzle 64b, and recovers the liquid LQ that has been supplied to the space SP1 between the projection optical system 30 and the wafer 40, via the recovery tube 64a and the recovery nozzle 64b. The recovery tube 64a is arranged, as shown in FIG. 2, around the side surface 330 of the final lens 300 in the projection optical system 30. The recovery nozzle 64b is connected to the liquid recovery unit 64 via the recovery tube 64a.

The liquid recovery unit 64 preferably includes, for example, a tank that temporarily stores the recovered liquid LQ, and a suction unit that sucks the liquid.

The supply tube 62a, the supply nozzle 62b, the recovery tube 64a, and the recovery nozzle 64b are integrated near the final lens 300 in this embodiment, and form a liquid supply/recovery part 68 in which the supply nozzle 62b is arranged inside the recovery nozzle 64b. A space SP2 between the side surface 330 of the final lens 300 and the liquid supply/recovery part 68 is generally set to about 0.7 mm. Therefore, the capillary phenomenon lifts up the liquid LQ from a second surface 320 of the final lens 300 by about 7 mm in the space SP2.

The immersion controller 70 obtains from the controller 80 information of the wafer stage 45, such as a current position, a speed, acceleration, a target position, and a moving direction, and controls the immersion exposure based on the information. The immersion controller 70 controls through the liquid supply/recovery unit 60 over a switch between supplying and recovering of the liquid LQ, stops of both the supply and recovery of the liquid LQ, and the amounts of the supplied or recovered liquid LQ.

The controller 80 includes a CPU and a memory (not shown), and controls operations of the exposure apparatus 1, in particular, driving of the reticle stage 25 and the wafer stage 45. The controller 80 is electrically connected to the illumination apparatus 10, the reticle stage 25 (or the moving mechanism (not shown) of the reticle stage 25), the wafer stage 45 (or the moving mechanism (not shown) of the wafer stage 45), and the immersion controller 70. The CPU includes any processor irrespective of its name, such as an MPU, and controls operations of each component. The memory includes a ROM and a RAM, and stores firmware that operates the exposure apparatus 1.

A description will now be given of the final lens 300 that contacts the liquid LQ, is arranged closest to or faces the wafer 40 in the projection optical system 30. Referring to FIG. 2, the side surface 330 of the final lens 300 contains part that does not contribute to the optical operation, as discussed above, and has conventionally been referred to as a machined or cut surface with a surface roughness of several tens micrometers to several hundreds nanometers when expressed by a PV value. The side surface 330 of the final lens 300 of this embodiment has a polished surface with a desired surface roughness, such as a several tens micrometers to several angstroms. The PV value is a difference between a peak point value and a valley point value.

A description will be given of the reason why the side surface 330 of the final lens 300 is processed into the polished surface. The first surface 310 and the second surface 320 of the final lens 300 have conventionally been polished with the abrasive, such as cerium dioxide and iron oxide, or the pitch material, such as asphalt. Therefore, when the side surface 330 of the final lens 300 has a cut surface with a surface roughness of several tens micrometers to several hundreds nanometers when expressed by a PV value, the abrasive or pitch material adheres due to the storage condition from the polishing process to the cleansing process. In other words, particles, such as abrasives and pitch materials are likely to fix onto the cut surface having a large surface roughness, and the adhered particles are hard to remove in the cleansing process. The particles, such as the abrasive and pitch material, which have fixed onto the side surface 330 of the final lens 300 float in the layer of the liquid LQ in the space SP1 through the liquid LQ in the space SP2, as described above.

Accordingly, this embodiment forms such a flat polished side surface 330 of the final lens 300 with a PV value of several tens micrometers to several angstroms that the particles, such as the abrasive and pitch material, are less likely to adhere or fix to the surface. In addition, the polished side surface 330 of the final lens 300 enables the cleansing process to easily remove the particles, if any.

The side surface 330 of the final lens 300 preferably has a surface roughness smaller than 60 nm when expressed by the PV value. The immersion-type exposure apparatus resolves the CD (half pitch) between 40 nm and 60 nm, and it is thus important to prevent the particles greater than at least the CD from floating in the layer of the liquid LW. In other words, the polished surface having a surface roughness smaller than 60 nm when expressed by the PV value substantially prevents the adhesions of the particles greater than 60 nm, consequently preventing the particles greater than 60 nm from floating in the layer of the liquid LQ. Given the polished surface with a surface roughness smaller than 60 nm, the cleansing process would easily remove the particles even if they adhere to the polished surface. This configuration thus prevents the particles from adhering to the surface of the wafer 40, from breaking the wiring structure, and from causing the partial low contrast due to blocking of the imaging light.

The polished range of the side surface 330 of the final lens 300 or the range of the polished surface is limited to a range that may contact the liquid LQ. More specifically, since the capillary phenomenon lifts up the liquid LQ from the second surface 320 of the final lens 300 in the space SP2 by about 7 mm, the side surface 330 should have a polished surface that covers at least a position apart from the second surface 320 by about 7 mm.

When the side surface 330 has plural surfaces, at least surfaces that may contact the liquid LQ may be set to the polished surface.

$CaF_2$ is deliquescent to the liquid LQ that is water, and the final lens 300 made of $CaF_2$ needs a protective film on its surface. On the other hand, $SiO_2$ is not deliquescent to the liquid LQ that is water. When the final lens 300 is made of $SiO_2$, only the polished surface can be set to the surface of the second surface 320 without the protective film and its surface roughness is about several angstroms. Therefore, the second surface 320 of the projection optical system 300 is not affected by the adhesions and floats of the particles, and a polished surface may be similarly set to the side surface 330 by about several angstroms.

Figure 3:
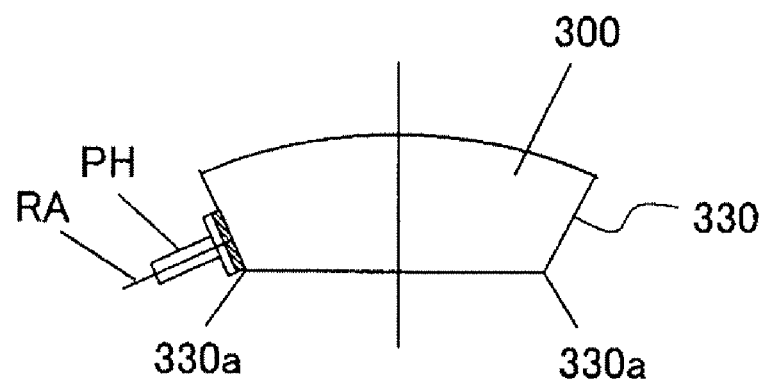
FIG. 3 is a view showing a polishing state of a side surface of the final lens.

FIG. 3 shows a polishing state of the side surface 330 of the final lens 300 (or a processing state into the polished surface). Referring to FIG. 3, a polishing head PH is arranged perpendicular to the side surface 330 of the final lens 300 via a rotating axis RA. The polishing head PH rotates around the rotating axis RA, scans the side surface 330, and polishes the side surface 330 of the final lens 300. Preferably, a connection part 330a between the second surface 320 and the side surface 330 of the final lens 300 is chamfered or rounded with a radius of 1 mm so as not to block the effective diameter of the second surface 320.

Figure 4:
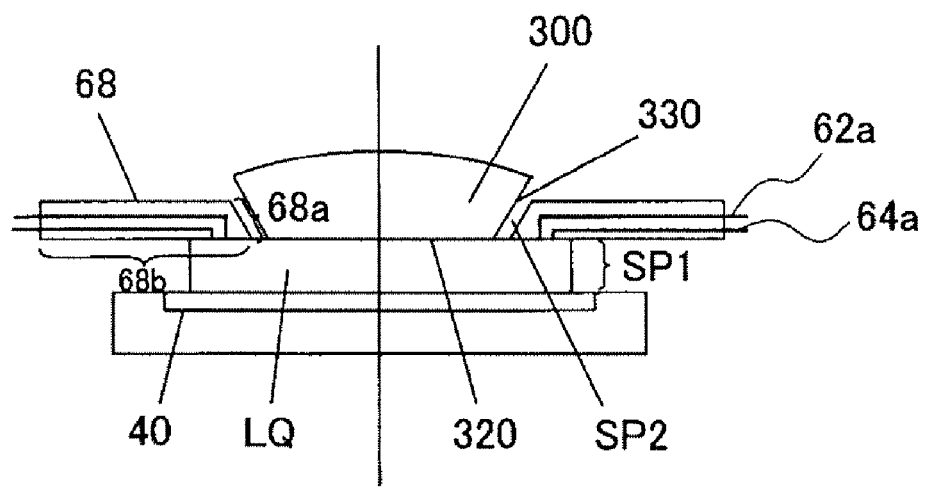
FIG. 4 is an enlarged sectional view around the final lens and a liquid supply/recovery part.

The final lens 300 is not only the source of the particles to be mixed in the liquid LQ. As shown in FIG. 4, surfaces 68a and 68b of the liquid supply/recovery part 68 contact the liquid LQ. Thus, depending upon the surface roughness states of the surfaces 68a and 68b, the particles that have adhered to these surfaces can float in the liquid LQ. Accordingly, this embodiment also processes each of the surfaces 68a and 68b into a polished surface with a PV value between several tens nanometers and several angstroms, e.g., smaller than 60 nm. Here, FIG. 4 is an enlarged sectional view around the final lens 300 in the projection optical system 30 and the liquid supply/recovery part 68.

The liquid supply/recovery part 68 is preferably made of ceramic (SiC) in a metallic material, or $SiO_2$ in a glass material, to reduce the elution of the particle to the liquid LQ.

When the liquid supply/recovery part 68 is made of the metallic material, the normal metallic process can achieve a surface roughness of only about 2 μm to 3 μm (PV value). Accordingly, the ultra-smooth machining process is used to provide a surface roughness of smaller than 60 nm (PV value) to the surfaces 68a and 68b of the metal liquid supply/recovery part 68. The ultra-smooth machining process includes chemical vaporization machining using plasma for the chemical mechanical polishing, liquid etching using a high-temperature fused salt, such as potassium hydroxide, and chemical mechanical polishing using chromic oxide.

When the liquid supply/recovery part 68 is made of the glass material, such as quartz glass like the final lens 300, a polishing method using cerium oxide can provide a surface roughness of smaller than 60 nm (PV value) to the surfaces 68a and 68b of the liquid supply/recovery part 68.

Figure 5:
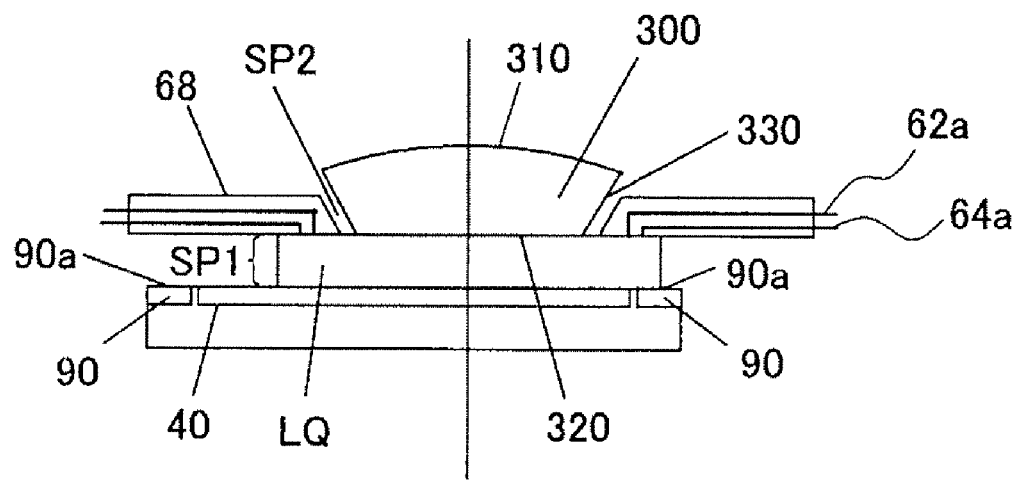
FIG. 5 is an enlarged sectional view around the final lens and a flat-topped plate.

When the exposure apparatus 1 includes, as shown in FIG. 5, a flat-topped plate (auxiliary plate) 90, which located around the wafer 40 and is level with the top surface of the wafer 40, the flat-topped plate 90 can be a source of the particle mixed in the liquid LQ. As shown in FIG. 5, a partial surface 90a of the flat-topped plate 90 contacts the liquid LQ during scanning. Thus, depending upon the surface roughness state of the surface 90a, the particles adhering to the surface 90a can float in the liquid LQ. Accordingly, this embodiment also processes a surface 90a of the flat-topped plate 90 into a polished surface with a PV value between several tens nanometers and several angstroms, e.g., smaller than 60 nm. Here, FIG. 5 is an enlarged sectional view around the final lens 300 in the projection optical system 30 and the flat-topped plate 90.

The flat-topped plate 90 is preferably made of ceramic (SiC) in a metallic material, or $SiO_2$ in a glass material, to reduce the elution of the particle to the liquid LQ.

When the flat-topped plate 90 is made of the metallic material, the normal metallic process can provide a surface roughness of only about 2 μm to 3 μm (PV value). Accordingly, the above ultra-smooth machining process is used to provide a surface roughness of smaller than 60 nm (PV value) to the surface 90a of the metal flat-topped plate 90.

When the flat-topped plate 90 is made of the glass material, such as quartz glass like the final lens 300, the polishing method using cerium oxide can provide a surface roughness of smaller than 60 nm (PV value) to the surface 90a of the flat-topped plate 90.

In exposure, the illumination optical system 14 e.g., Koehler-illuminates the reticle 20 using the light emitted from the light source unit 12. The light that passes the reticle 20 and reflects the reticle pattern is imaged on the wafer 40 by the projection optical system 30 and the liquid LQ. The liquid LQ used for the exposure apparatus 1 is restrained from generating the particles that negatively affect the optical characteristic, break the wire structure or cause the partial low contrast. Thereby, the exposure apparatus 1 can provide higher quality devices (such as semiconductor devices, a liquid crystal devices, and the like) than ever at a high throughput and economical efficiency.

Figure 6:
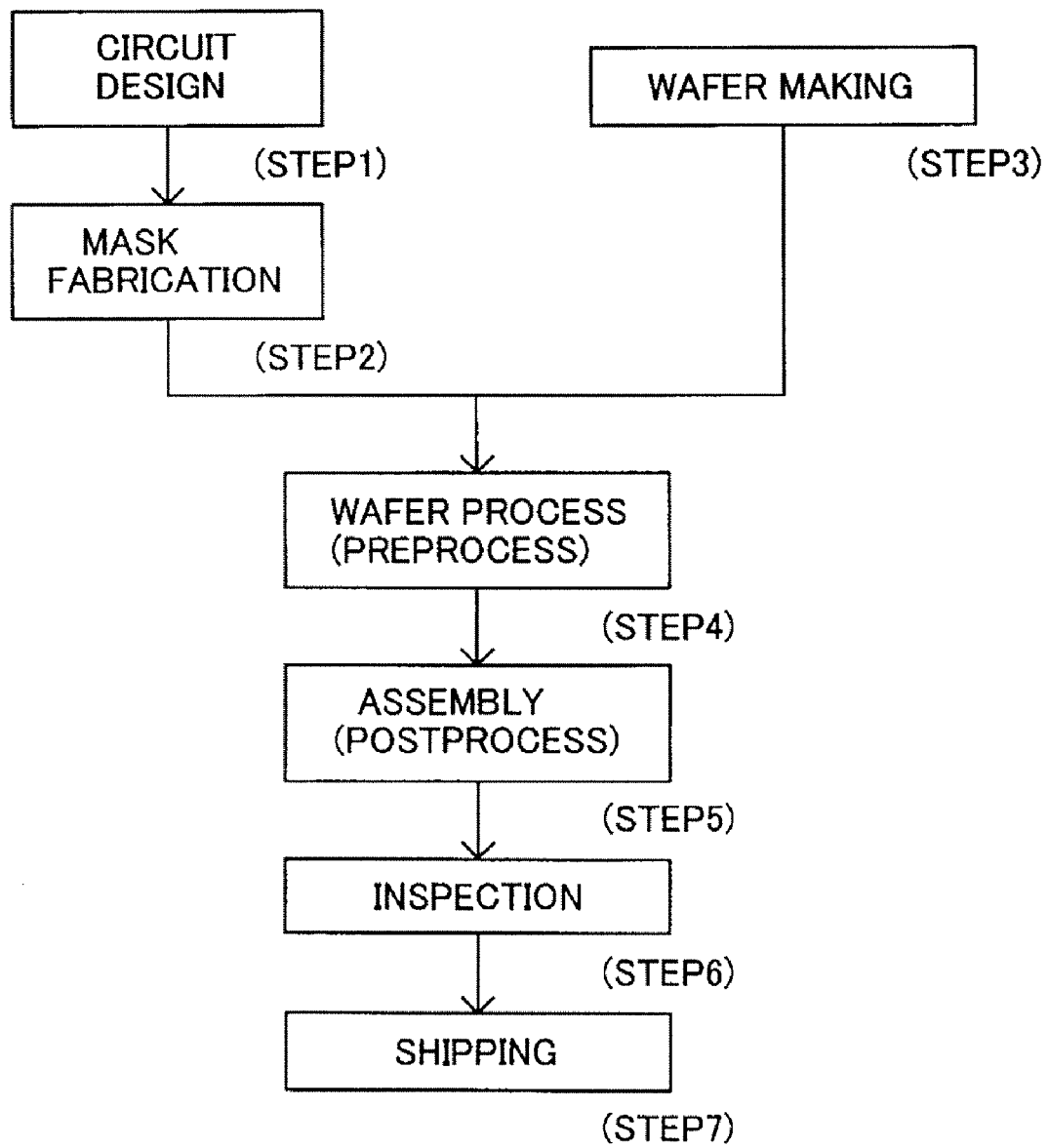
FIG. 6 is a flowchart for explaining manufacture of devices.
Figure 7:
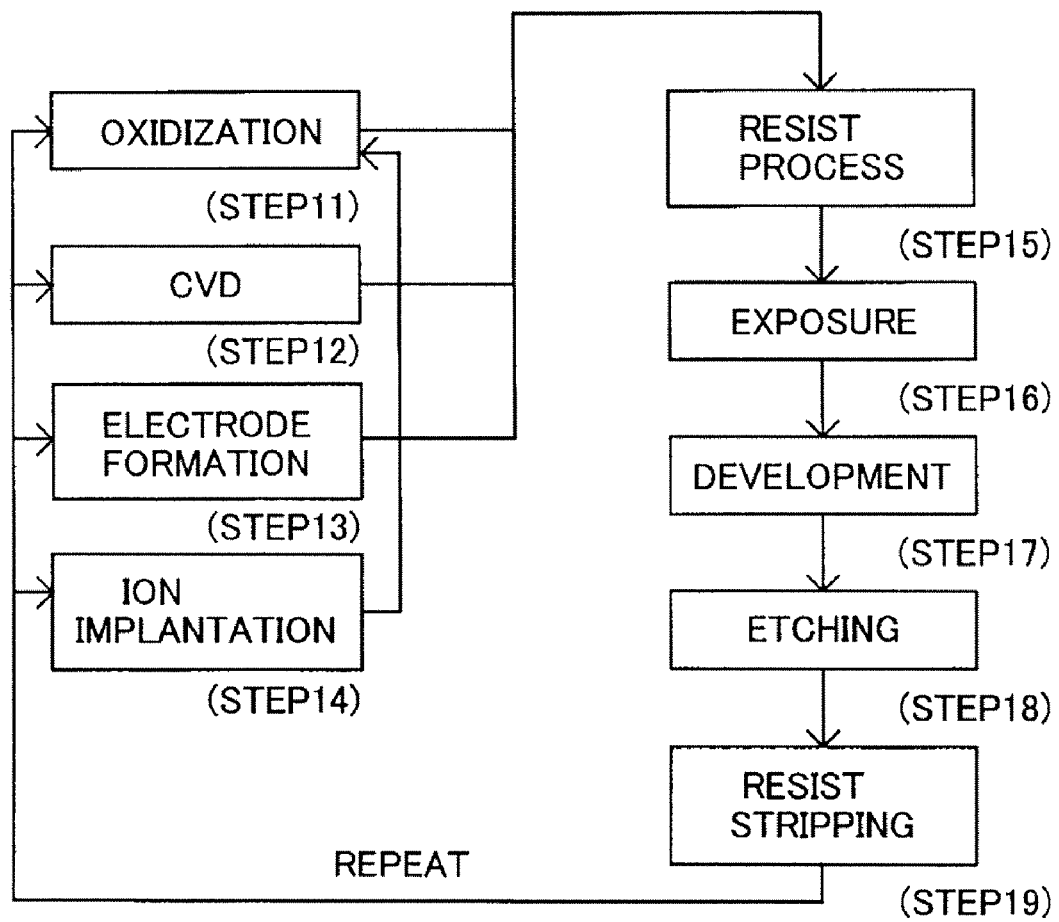
FIG. 7 is a detailed flowchart of a wafer process as Step 4 shown in FIG. 6.

Referring now to FIGS. 6 and 7, a description will now be given of an embodiment of a device manufacturing method using the exposure apparatus 1. FIG. 6 is a flowchart for explaining a fabrication of devices. Here, a description will be given of a fabrication of a semiconductor device as an example. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is referred to as a pretreatment, forms actual circuitry on the wafer through photolithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 7 is a detailed flowchart of the wafer process in Step 4 shown in FIG. 10. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 1 to expose a mask pattern onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. This device manufacturing method can manufacture higher quality devices than ever. Thus, the device manufacturing method that uses the exposure apparatus 100, and its resultant products also constitute one aspect of the present invention.

Further, the present invention is not limited to these preferred embodiments, and various variations and modifications may be made without departing from the scope of the present invention. For example, when the supply tube, the supply nozzle, the recovery tube, the recovery nozzle used for supply and recovery of the liquid are not integrated, each of the supply tube, the supply nozzle, the recovery tube, the recovery nozzle may have a part that contacts the liquid and is polished into a PV value smaller than 60 nm. In addition, it is preferable to form a polished surface with a PV value smaller than 60 nm on a part that contacts the liquid in addition to the final lens, the liquid supply/recovery part, and the flat-topped plate.

This application claims a benefit of priority based on Japanese Patent Application No. 2005-331330, filed on Nov. 16, 2005, which is hereby incorporated by reference herein in its entirety as if fully set forth herein.

What is claimed is:

1. An exposure apparatus comprising:
    an illumination optical system for illuminating a reticle using light from a light source; and
    a projection optical system for projecting a pattern of the reticle onto a substrate, said exposure apparatus being suitable for exposing the substrate through a liquid that is supplied to a space between the substrate and a lens of the projection optical system closest to the substrate,
    wherein the lens is made of $SiO_2$,
    wherein a surface of the lens which the light does not pass through and which the liquid directly contacts, includes a polished surface which is polished to prevent an adhesion of particles,
    wherein the polished surface is a cleaned polished surface on which a protective film is not formed, and wherein the lens is incorporated into the projection optical system such that the liquid is supplied to the space between the substrate and the lens so that the liquid directly contacts the cleaned polished surface.

2. An exposure apparatus according to claim 1, further comprising a liquid supply/recovery part that is located around the lens, and configured to supply the liquid and recover the liquid, wherein a part that directly contacts the liquid of the liquid supply/recovery part includes a polished surface which is polished to prevent an adhesion of particles.

3. An exposure apparatus according to claim 1, further comprising an auxiliary member that is located around the substrate, is level with surface of the substrate, and, along with the substrate, supports the liquid, wherein a part that directly contacts the liquid of the auxiliary member includes a polished surface which is polished to prevent an adhesion of particles.

4. A device manufacturing method comprising:
a step of exposing a substrate using an exposure apparatus; and,
a step of developing the substrate that has been exposed,
wherein the exposure apparatus comprises:
an illumination optical system for illuminating a reticle using light from a light source; and
a projection optical system for projecting a pattern of the reticle onto a substrate, said exposure apparatus being suitable for exposing the substrate through a liquid that is supplied to a space between the substrate and a lens of the projection optical system closest to the substrate,
wherein the lens is made of $SiO_2$,
wherein a surface of the lens which the light does not pass through and which the liquid directly contacts, includes a polished surface which is polished to prevent an adhesion of particles,
wherein the polished surface is a cleaned polished surface on which a protective film is not formed, and
wherein the lens is incorporated into the projection optical system such that the liquid is supplied to the space between the substrate and the lens so that the liquid directly contacts the cleaned polished surface.

5. An exposure apparatus according to claim 1, wherein the surface of the lens through which the light does not pass and which directly contacts the liquid is a polished surface which has a surface roughness smaller than 60 nm when expressed by the PV value.

6. An exposure apparatus according to claim 2, further comprising an auxiliary member that is located around the substrate, is level with surface of the substrate, and, along with the substrate, supports the liquid, wherein a part that directly contacts the liquid of the auxiliary member includes a polished surface which is polished to prevent an adhesion of particles.

7. An exposure apparatus according to claim 1, wherein a connection part between a surface of the lens which the light does not pass through and a surface of the lens which the light passes through is chamfered or rounded.

* * * * *